United States Patent
Sheen et al.

(10) Patent No.: US 7,563,654 B2
(45) Date of Patent: Jul. 21, 2009

(54) METHOD OF MANUFACTURING SEMICONDUCTOR DEVICE FOR FORMATION OF PIN TRANSISTOR

(75) Inventors: Dong Sun Sheen, Kyoungki-do (KR); Seok Pyo Song, Seoul (KR); Sang Tae Ahn, Kyoungki-do (KR); Hyeon Ju An, Kyoungki-do (KR); Hyun Chul Sohn, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 395 days.

(21) Appl. No.: 11/647,759

(22) Filed: Dec. 29, 2006

(65) Prior Publication Data

US 2007/0281454 A1    Dec. 6, 2007

(30) Foreign Application Priority Data

May 30, 2006   (KR) .................. 10-2006-0049090

(51) Int. Cl.
*H01L 21/335* (2006.01)
(52) U.S. Cl. .................. 438/142; 438/149; 438/279; 257/259; 257/295
(58) Field of Classification Search .................. 438/142, 438/149, 279; 257/259, 295
See application file for complete search history.

(56) References Cited

U.S. PATENT DOCUMENTS

| | | | | |
|---|---|---|---|---|
| 5,614,431 A | * | 3/1997 | DeBrosse | 438/243 |
| 5,880,006 A | * | 3/1999 | Lin et al. | 438/424 |
| 5,930,633 A | * | 7/1999 | Liaw | 438/296 |
| 6,624,021 B2 | * | 9/2003 | Noble | 438/253 |
| 2006/0270153 A1 | * | 11/2006 | Lee | 438/253 |
| 2007/0045729 A1 | * | 3/2007 | Hoentschel et al. | 257/344 |
| 2007/0069293 A1 | * | 3/2007 | Kavalieros et al. | 257/350 |

FOREIGN PATENT DOCUMENTS

KR    102005-0000132    1/2005

OTHER PUBLICATIONS

Korean Patent Gazette from Korean Intellectual Property Office.

* cited by examiner

*Primary Examiner*—Thanh V Pham
(74) *Attorney, Agent, or Firm*—Ladas & Parry LLP

(57) ABSTRACT

A method for manufacturing a semiconductor device is disclosed. The method includes the steps of defining a trench into a field region of a semiconductor substrate having an active region and the field region; partially filing the trench with a flowable insulation layer; completely filling the trench with an isolation structure by depositing a close-packed insulation layer on the flowable insulation layer in the trench; etching through a portion of the close-packed insulation layer and etching into a partial thickness of the flowable insulation layer of the insulation structure to expose a portion of the active region; cleaning the resultant substrate having the active region relatively projected; forming spacers on etched portions of the flowable insulation layer where bowing occurs during the cleaning step; and forming gates on the active region and the insulation structure to border the exposed portion of the active region.

19 Claims, 12 Drawing Sheets

METHOD OF MANUFACTURING SEMICONDUCTOR DEVICE FOR FORMATION OF PIN TRANSISTOR

CROSS-REFERENCE TO RELATED APPLICATIONS

The present application claims priority to Korean patent application number 10-2006-0049090 filed on May. 30, 2006, which is incorporated herein by reference in its entirety.

BACKGROUND OF THE INVENTION

The present invention relates to a method for manufacturing a semiconductor device, and more particularly, to a method for manufacturing a semiconductor device which can prevent the excessive loss of an isolation structure and the occurrence of a defect when forming a pin transistor.

As the design rule of a semiconductor memory device abruptly decreases, the length and the width of the channel of a transistor decrease, and the doping level of a junction region increases, so that a junction leakage current increases due to the increase of an electric field. According to this, in the conventional transistor having a two-dimensional planar channel structure, it is difficult to obtain a threshold voltage demanded in a high integration semiconductor device, and limitations exist in improving a refresh characteristic. In consideration of this fact, research have actively been made to develop a transistor having a three-dimensional channel structure in which a channel length can be increased. As a result of the research, recently, a pin transistor having a three-dimensional channel structure has been disclosed in the field of a logic device.

In the pin transistor, an active region is relatively projected by etching a field region, and gates are formed to border the projected active region. As the side surfaces, as well as, the upper surface of the projected active region form a channel area, the resultant pin transistor results in having an increased channel length when compared to a transistor having a planar structure. Hence, in the pin transistor, an excellent current driving characteristic can be attained through the momentary increase of a current amount. Also, since an on/off characteristic of the pin transistor is excellent, a semiconductor device having a high operation speed can be realized. In addition, because the pin transistor has low back bias dependency, a desired device characteristic can be attained.

Hereafter, a conventional pin transistor will be schematically explained.

FIG. 1 is a plan view of a semiconductor device, and FIGS. 2A through 2C are cross-sectional views taken along the lines A-A' and B-B' of FIG. 1, which illustrates some of the processes of more conventional methods for manufacturing a semiconductor device. In FIG. 1, the reference numeral A/R designates an active region, F/R a field region, and G a gate.

Referring to FIG. 2A, a trench T is defined by etching the field region F/R of a semiconductor substrate 200 having an active region A/R and a field region F/R. By forming an insulation layer in the trench T, an isolation structure 216 is formed. The isolation structure 216 is formed as a stacked layer of an SOG (spin-on glass) oxide layer (hereinafter, referred to as an "SOG layer") 212 and an HDP-CVD (high density plasma-chemical vapor deposition) oxide layer (hereinafter, referred to as "HDP layer") 214. The reason to form the isolation structure 216 in this way is to improve a trench filling characteristic for filling a trench which has a fine size due to the high integration of a semiconductor device.

Referring to FIG. 2B, the HDP layer 214 and a partial thickness of the SOG layer 212 of the isolation structure 216 are etched so that the side surfaces of the active region A/R are exposed. As a result of the etching, when viewed in a channel width direction, that is, in the direction of the line B-B', the HDP layer 214 is entirely removed, and the SOG layer 212 is exposed.

Referring to FIG. 2C, a cleaning process is conducted for the semiconductor substrate 200 having the etched isolation structure 216, using for example either a diluted HF solution or a diluted $NH_4F$ solution. At this time, due to the fact that the SOG layer 212 has a greater etch rate than the HDP layer 214 in the diluted HF solution or the diluted $NH_4H$ solution, as a result of the cleaning process, a bowing phenomenon occurs in which the SOG layer 212 is etched more than the HDP layer 214.

After a gate insulation layer 222, a polysilicon layer 224, a metallic layer 226 and a hard mask 228 are sequentially formed on the cleaned semiconductor substrate 200, by etching these layers 228, 226, 224 and 222, a gate 230 is formed.

Thereafter, while not shown in the drawings, by forming source and drain areas in the active region A/R of the semiconductor substrate 200 on both sides of the gate 230, a pin transistor is formed.

However, in the conventional method of manufacturing a semiconductor device for the formation of a pin transistor, problems are caused in that a short circuit occurs between adjoining gates, and the operation speed of a semiconductor device decreases due to parasitic capacitance. That is to say, in the conventional art, a bowing phenomenon occurs on the SOG layer in the cleaning process, and when gate processes are conducted with the bowing phenomenon occurred, as shown in FIG. 3, the polysilicon layer 224 remains in the bowing areas of the SOG layer 212. Thus, a short circuit occurs between adjoining gates due to the remaining of the polysilicon layer 224, parasitic capacitance increases, and the operation speed of the semiconductor device decreases. In particular, as the integration degree of a semiconductor device increases, the height, that is, the deposition thickness of the SOG layer 212 must be increased to fill a trench having a fine size, and the etch depth of the isolation structure 216 must be increased. Therefore, in the manufacture of the pin transistor, the exposure of the SOG layer 212 is inevitable, and it is expected that the problems caused therefrom will become more serious.

SUMMARY OF THE INVENTION

The present invention is directed to a method for manufacturing a semiconductor device which can prevent or at least minimize any subsequent defect from occurring due to bowing of an SOG layer when forming a pin transistor having an isolation structure comprising a stacked layer of the SOG layer and an HDP layer.

Also, the present invention is directed to a method for manufacturing a semiconductor device which can prevent or at least minimize any subsequent defect from occurring due to bowing of an SOG layer when forming a pin transistor, thereby increasing the yield and improving the reliability of a semiconductor device.

In one embodiment, a method for manufacturing a semiconductor device comprises the steps of defining a trench into a field region of a semiconductor substrate having an active region and the field region; forming a flowable insulation layer in the trench wherein the formed flowable insulation layer does not completely fill the trench; depositing an isolation structure of a close-packed insulation layer on the flowable insulation layer in the trench to completely fill the trench; etching through a portion of the the close-packed insulation layer and etching away a partial thickness of the flowable insulation layer of the isolation structure to expose a portion of the active region; cleaning the resultant substrate having the active region relatively projected; forming spacers on etched portions of the flowable insulation layer on which bowing occurs along the etched portions of the flowable insulation layer during the cleaning step; and forming gates on the active region and on the isolation structure to border the exposed portion of the active region.

The flowable insulation layer comprises an SOG layer, and the close-packed insulation layer comprises an HDP layer.

The step of forming a flowable insulation layer may comprise the sub steps of depositing the flowable insulation layer to fill the trench; baking the deposited flowable insulation layer; annealing the baked flowable insulation layer; and etching back a portion of the annealed flowable insulation layer so that the remaining portion of the annealed flowable insulation layer does not completely filling the trench.

The baking step is implemented at a temperature of 100~400° C., and the annealing step is implemented at a temperature of 300~700° C. under an atmosphere of any one selected from the group consisting of $O_2$, $H_2+O_2$, $H_2O$ and admixtures thereof.

The etching back step is implemented by wet etching using any one etchant selected from the group consisting of a diluted HF solution and a diluted $NH_4F$ solution such that the flowable insulation layer remaining in the trench at a thickness corresponding to ¼~¾ of a depth of the trench.

After the sub step of annealing the baked flowable insulation layer and before the sub step of etching back the annealed flowable insulation layer, the step of forming a flowable insulation layer further comprises the sub step of chemical mechanical polishing (CMPing) a partial thickness of the annealed flowable insulation layer.

The step of forming spacers may comprise the sub steps of forming a spacer insulation layer on the semiconductor substrate including the portions of the flowable insulation layer on which bowing occurs; and etching back a portion of the spacer insulation layer such that the spacers are formed on the portions of the flowable insulation layer on which bowing occurs, so that bowing is substantially eliminated.

The spacer insulation layer comprises a silicon oxide layer, and the silicon oxide layer is formed by thermal chemical vapor deposition at a temperature of 700~900° C., with a pressure of 0.05~10 Torr, and using any one source gas selected from the group consisting of $SiH_4$, $Si_2H_6$, $Si_2H_2Cl_2$, and admixtures thereof, and any one reaction gas selected from the group consisting of $N_2O$, $O_2$ and admixtures thereof.

The spacer insulation layer may be formed having a step coverage of 70~95%.

The spacer insulation layer may be formed to a thickness of 30~200 Å.

The sub step of etching back the spacer insulation layer is implemented by dry etching using plasma.

After the step of forming spacers and before the step of forming gates, the method may further comprise the step of pre-cleaning the resultant substrate formed with the spacers.

The pre-cleaning step may be implemented by wet etching using an HF additive solution or may be implemented by a dry etching using plasma such that 5~10 Å of a thickness of the spacer is etched.

After the step of defining a trench into the field region and before the step of forming a flowable insulation layer, the method may further comprise the steps of forming a wall oxide layer on a surface of the trench; and forming a liner nitride layer on the semiconductor substrate including the wall oxide layer.

DESCRIPTION OF SPECIFIC EMBODIMENTS

In the present invention, after exposing a portion of an active region by etching an isolation structure comprising a stacked layer of an SOG layer and an HDP layer, a cleaning process is conducted, and spacers are formed on the portions of the SOG layer on which bowing occurs in the remaining SOG layer due to the cleaning process. Then, subsequent gate processes are conducted.

In this case, since the bowing areas formed on the SOG layer are filled by the spacers, it is possible to avoid a phenomenon in which a gate material remains in undesired portions, that is, at the bowing areas of the SOG layer in the subsequent gate processes, so a defect such as a short circuit may occur. Therefore, in the present invention, because this type of defect is eliminated or at least minimized when forming a pin transistor, the yield and reliability of a semiconductor device can be expected to be increased and improved.

Hereafter, a method of manufacturing a semiconductor device for the formation of a pin transistor in accordance with an embodiment of the present invention will be described with reference to the attached drawings.

Figure 1:
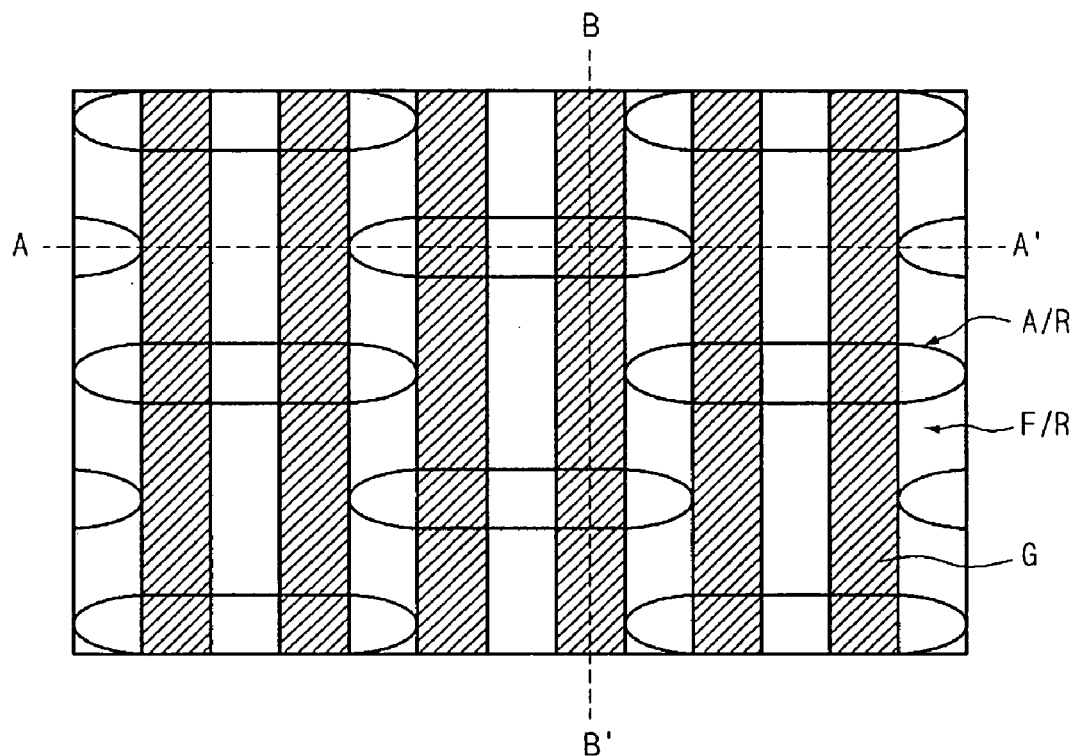
FIG. 1 is a plan view of a semiconductor device.
Figure 2A:
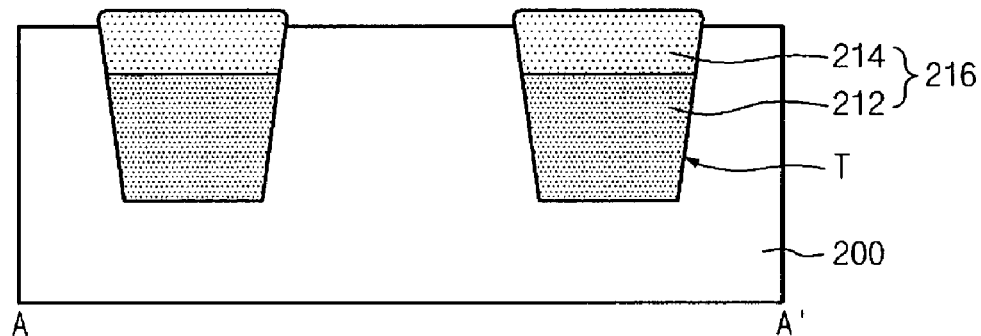
FIGS. 2A through 2C are cross-sectional views taken along the lines A-A' and B-B' of FIG. 1, explaining processes of a conventional method for manufacturing a semiconductor device.
Figure 2A:
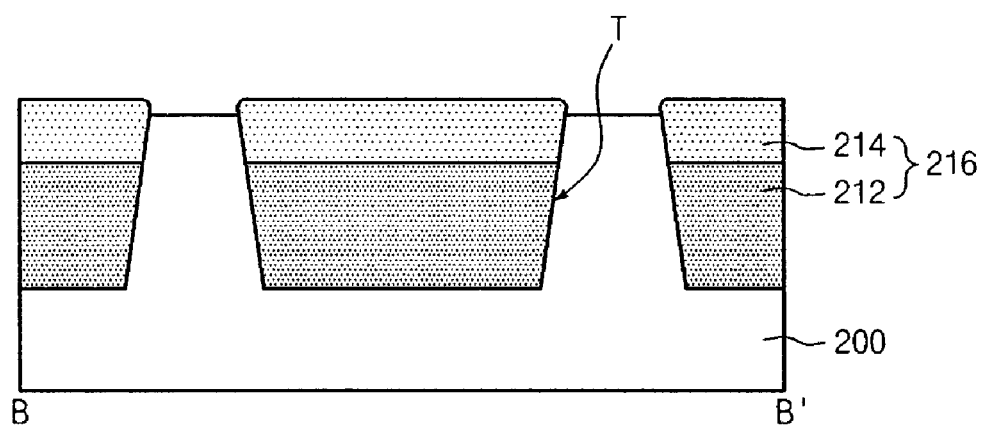
Figure 2B:
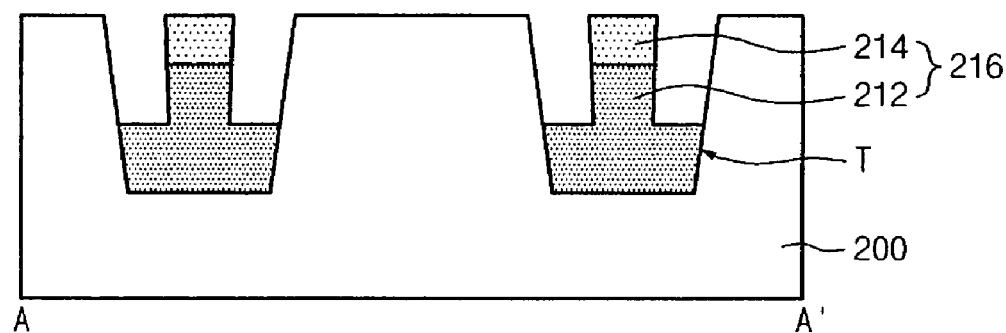
Figure 2B:
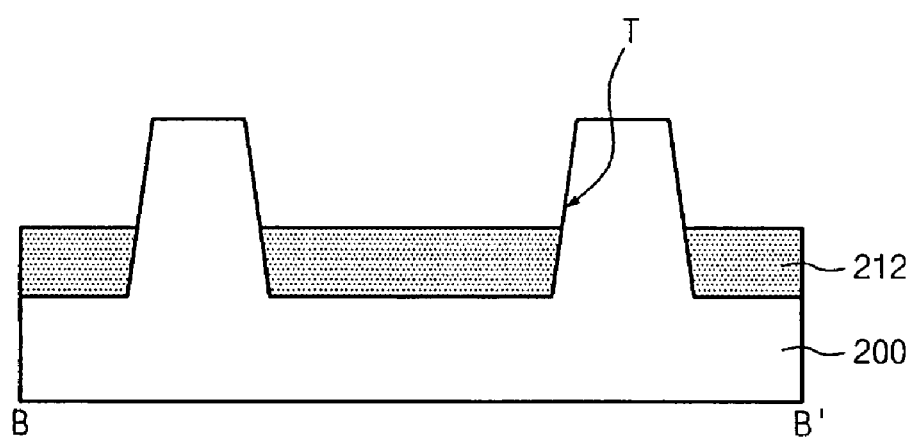
Figure 2C:
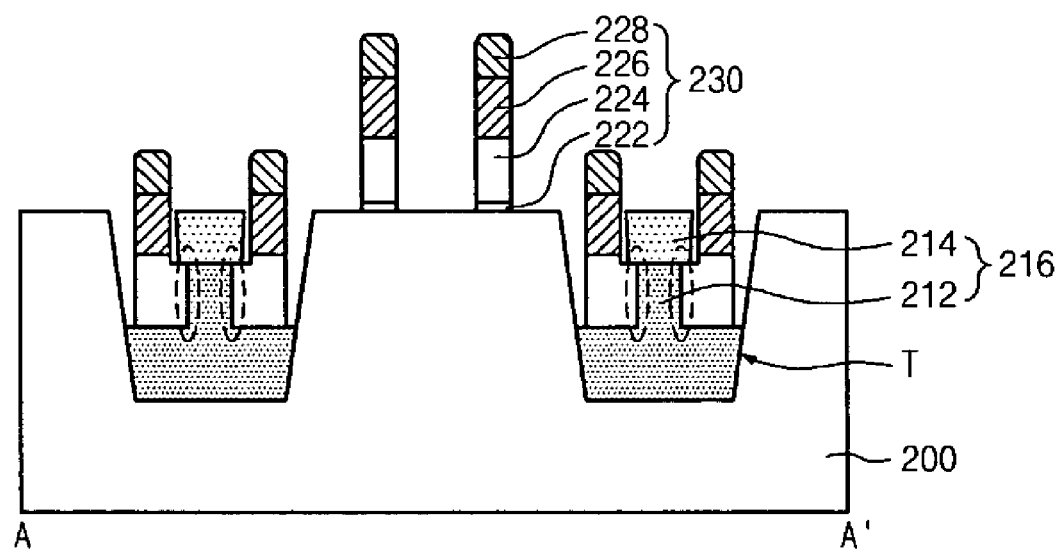
Figure 2C:
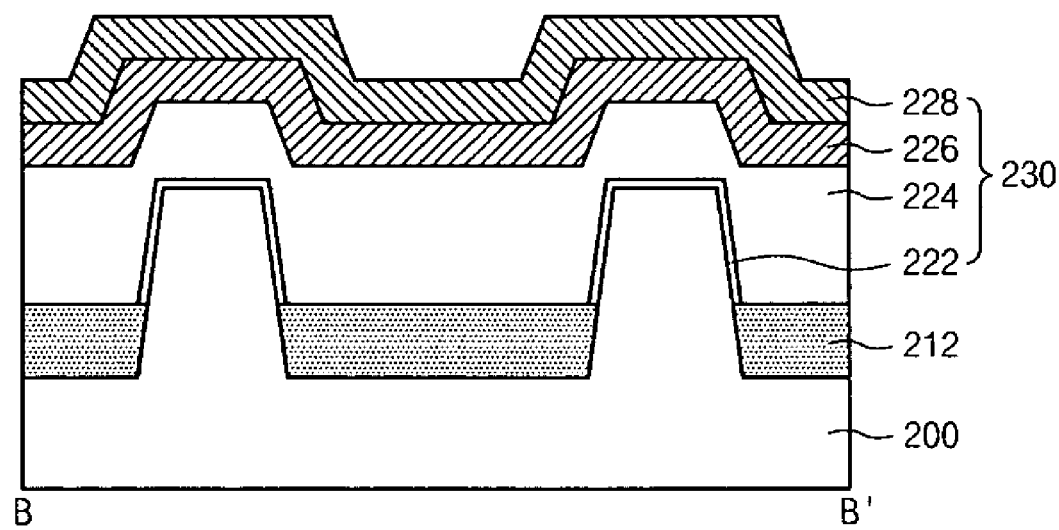
Figure 3:
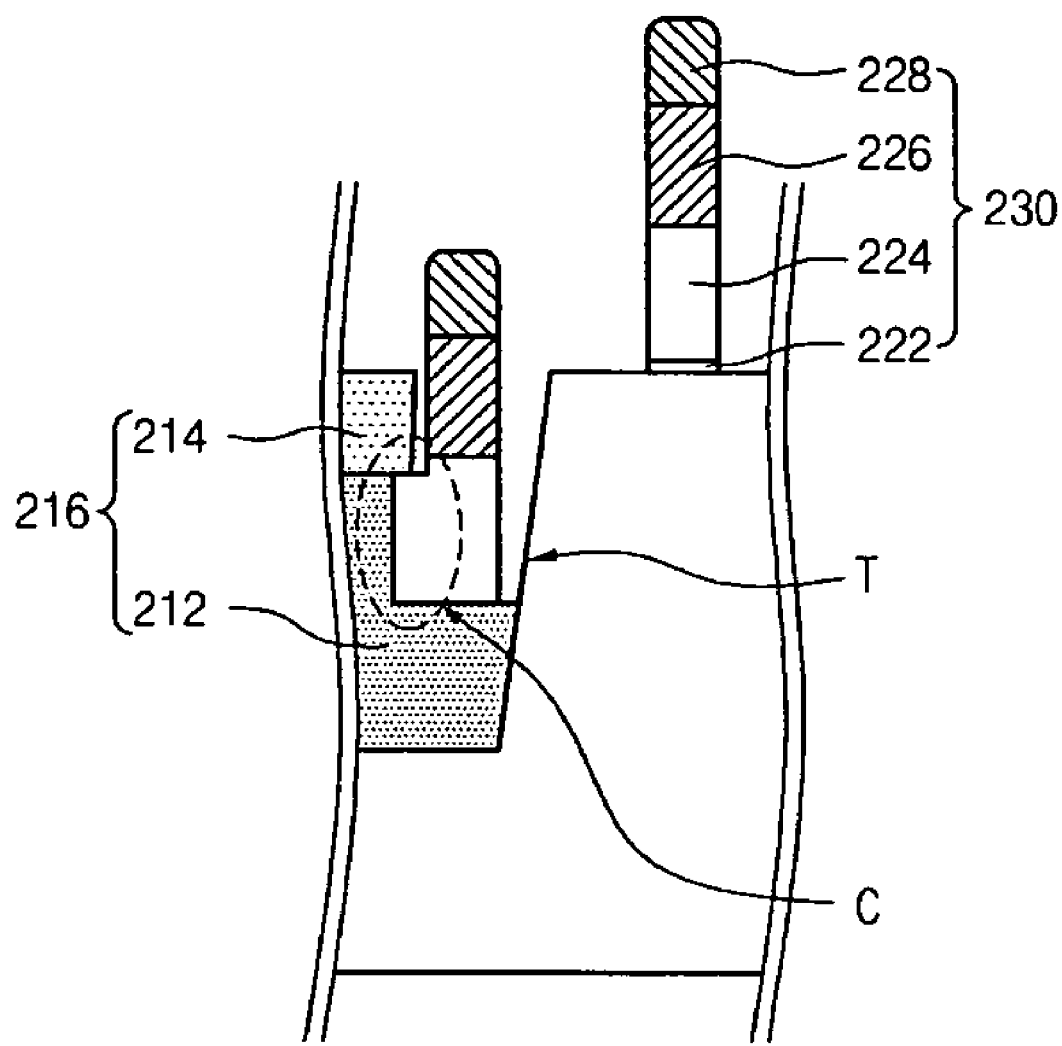
FIG. 3 is a cross-sectional view illustrating a problem caused in the conventional art.

FIGS. 4A through 4G are cross-sectional views taken along the lines A-A' and B-B' of FIG. 1, explaining processes of a method for manufacturing a semiconductor device in accordance with an embodiment of the present invention.

Figure 4A:
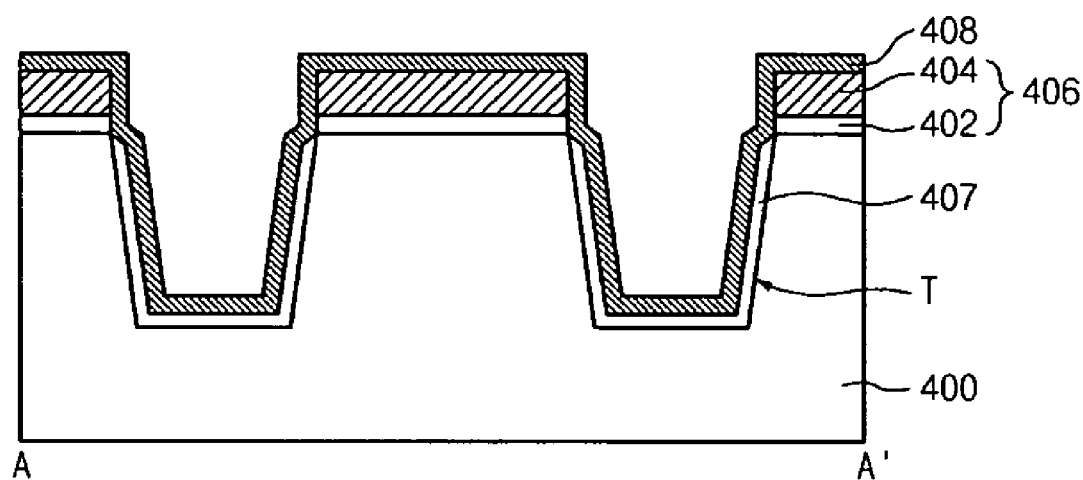
FIGS. 4A through 4G are cross-sectional views taken along the lines A-A' and B-B' of FIG. 1, explaining processes of a method for manufacturing a semiconductor device in accordance with an embodiment of the present invention.
Figure 4A:
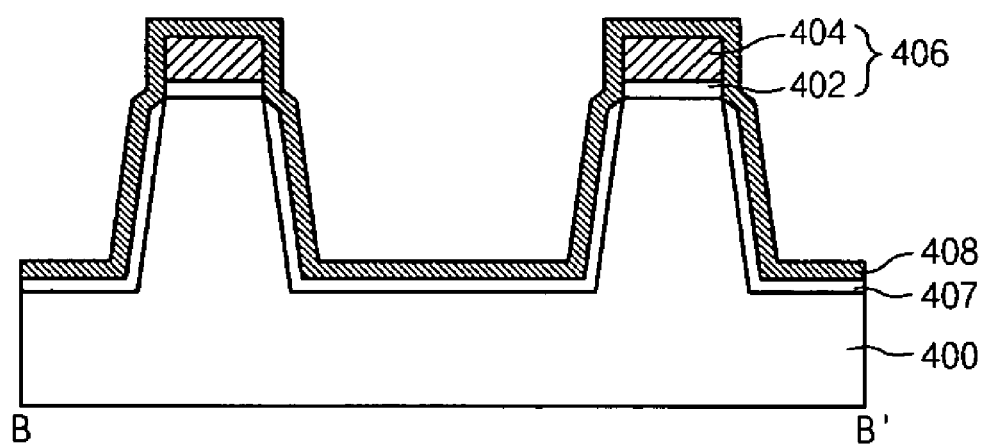

Referring to FIG. 4A, a first hard mask 406 which comprises a stacked layer of a pad oxide layer 402 and a pad nitride layer 404 is formed on a semiconductor substrate 400 having an active region and a field region to expose the field region. The exposed field region of the semiconductor substrate 400 is etched using the hard mask 406 as an etch mask, and through this, a trench T is defined. By conducting a wall oxidation process for the semiconductor device 400 defined with the trench T, a wall oxide layer 407 is formed on the surface of the trench T. A liner nitride layer 408 is deposited on the hard mask 406 including the wall oxide layer 407.

Figure 4B:
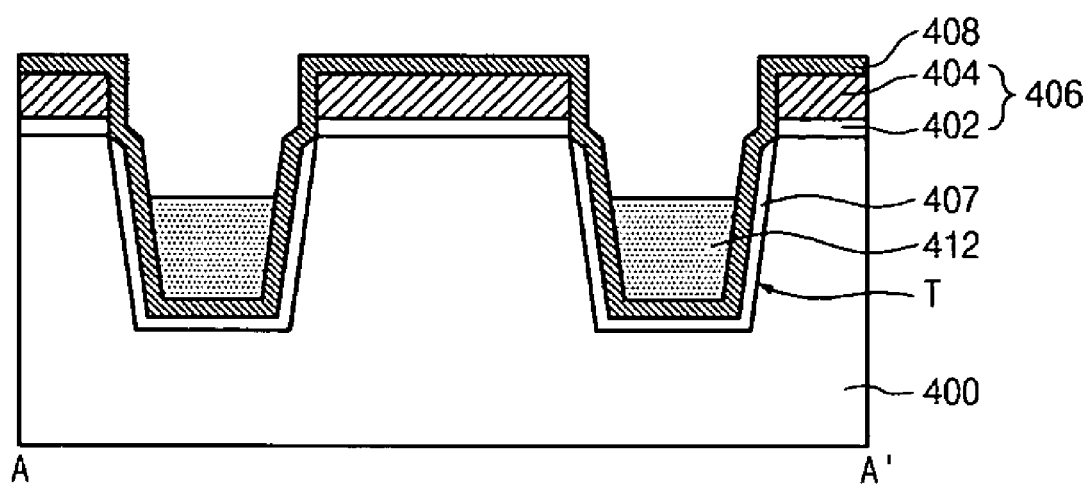
Figure 4B:
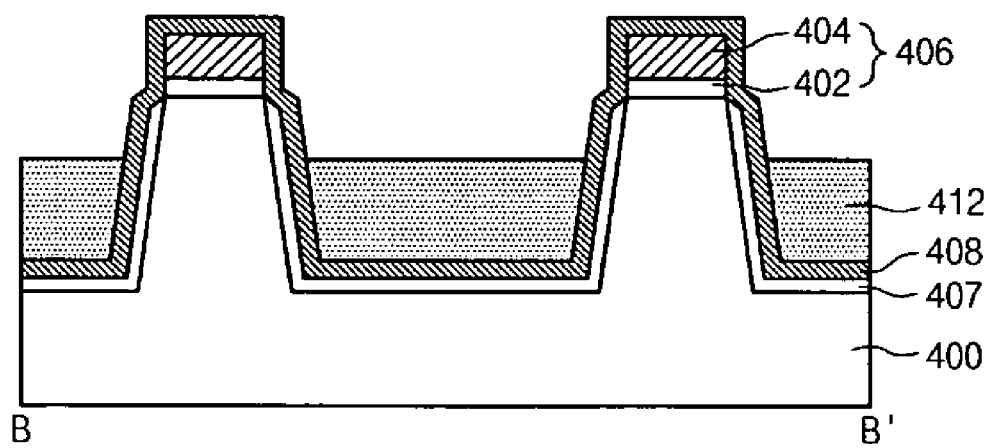

Referring to FIG. 4B, a flowable insulation layer having an excellent trench filling characteristic, for example, an SOG layer 412 is deposited on the liner nitride layer 408 to fill the trench T. The SOG layer 412 is subsequently baked at a temperature of 100~400° C. to stabilize it, and in succession, the baked SOG layer 412 is annealed to be hardened. The annealing is conducted at a temperature of 300~700° C. under an atmosphere of any one of $O_2$, $H_2+O_2$, $H_2O$ and admixtures thereof.

The SOG layer 412 is etched back sufficiently enough not to completely fill the trench T such that the portion of the SOG layer 412, which is originally filled in the upper portion of the trench T, is then removed. The etching back of the SOG layer 412 is conducted by wet etching using a diluted HF solution or a diluted NH$_4$F solution. Here, while the thickness of the SOG layer 412 remaining after the etching back is changed depending upon the trench filling characteristic and the design rule of a close-packed insulation layer, for example, an HDP layer which is subsequently formed, it is generally determined to fill ¼~¾ of the overall depth of the trench T.

Meanwhile, before etching back the SOG layer 412, a CMP process may be conducted to planarize the SOG layer 412.

Figure 4C:
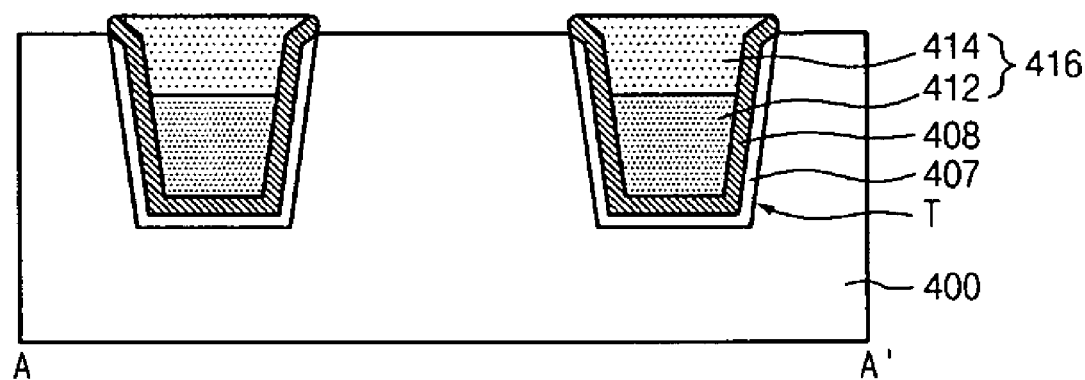
Figure 4C:
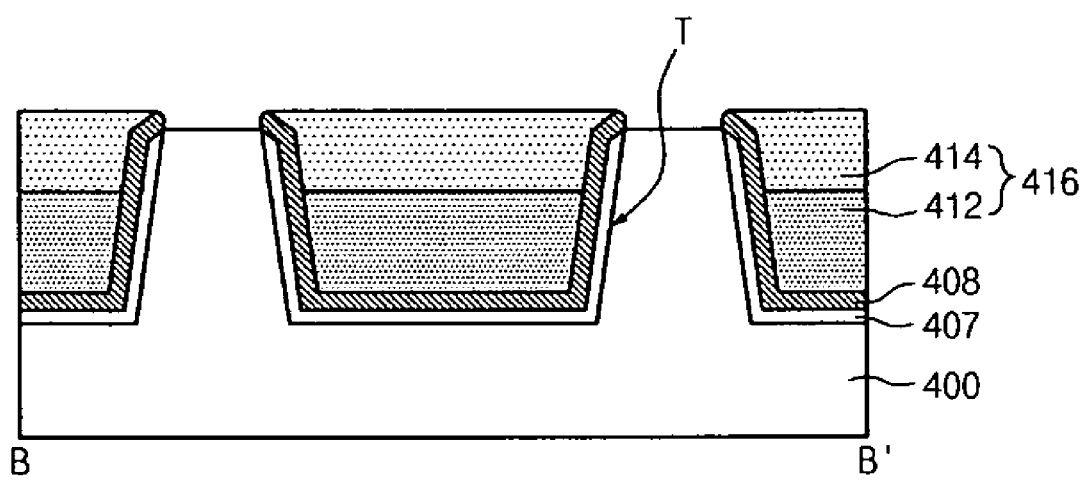

Referring to FIG. 4C, the close-packed insulation layer, for example, the HDP layer 414 is then deposited on the SOG layer 412 to completely fill the trench T. The HDP layer 414 and the liner nitride layer 408 are CMPed until the hard mask 406 is exposed, and in succession, the hard mask 406 is removed, by which an isolation structure 416 comprising a stacked layer of the SOG layer 412 and the HDP layer 414 is formed.

One of the reasons for forming the isolation structure 416 as the stacked layer of the SOG layer 412 and the HDP layer 414 is to improve a filling characteristic in the field region which has a fine size due to the high integration of a semiconductor device.

Figure 4D:
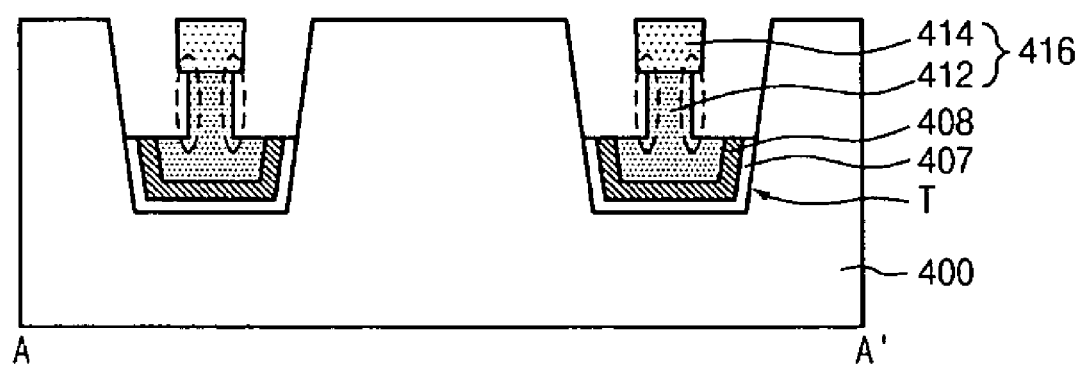
Figure 4D:
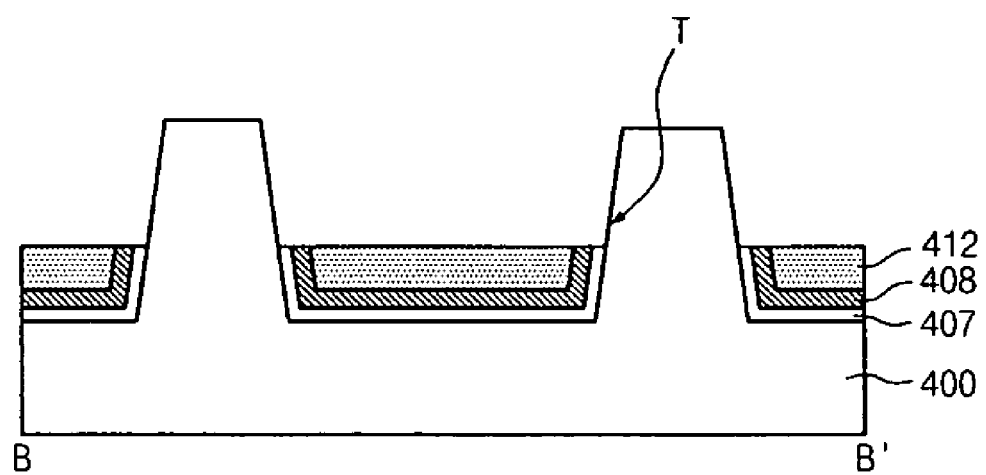

Referring to FIG. 4D, the HDP layer 414 and a partial thickness of the SOG layer 412 of the isolation structure 416 are then dry etched to expose a portion of the active region. The resultant substrate having the exposed portion of the active region is then cleaned. At this time, due to a difference in an etch rate between the HDP layer 414 and the SOG layer 412, the SOG layer 412 is etched slightly more, and according to this, a bowing phenomenon occurs on portions of the SOG layer 412 under the etched HDP layer 414.

Figure 4E:
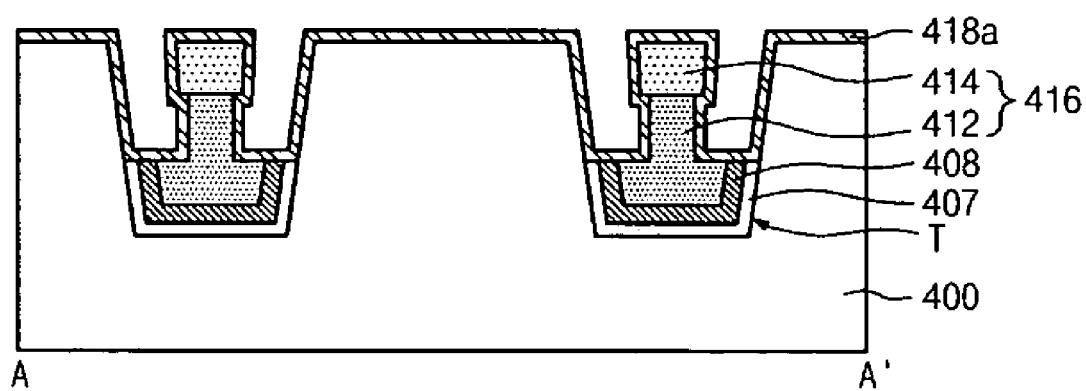
Figure 4E:
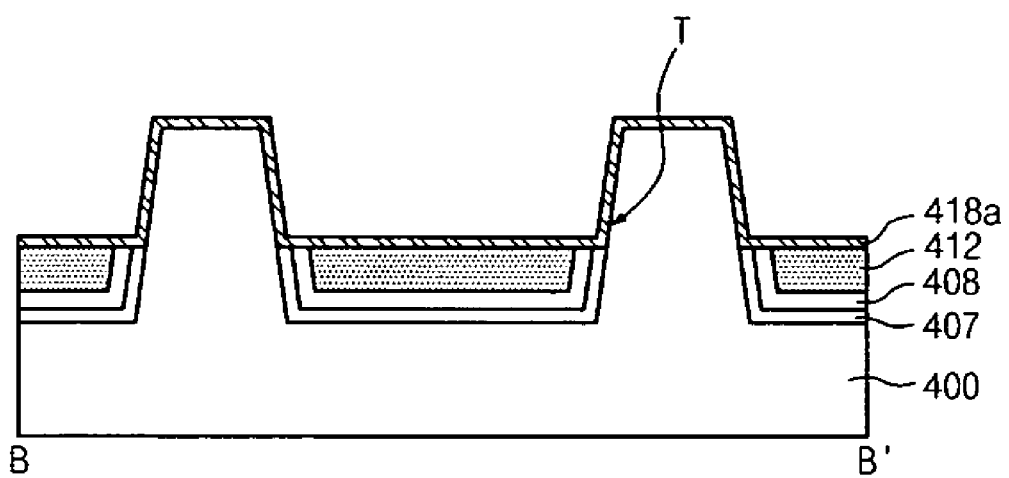

Referring to FIG. 4E, a spacer insulation layer 418a is formed on the semiconductor substrate 400 including the portions of the SOG layer 412 on which bowing occurs. The spacer insulation layer 418a comprises a layer having excellent step coverage, for example, a silicon oxide layer. The silicon oxide layer is formed by thermal chemical vapor deposition at a temperature of 700~900° C., with a pressure of 0.05~10 Torr, and using any one source gas of SiH$_4$, Si$_2$H$_6$, Si$_2$H$_2$Cl$_2$ and admixtures thereof and any one reaction gas of N$_2$O, O$_2$ and admixtures thereof. At this time, the spacer insulation layer 418a is formed to a thickness of 30~200 Å having a step coverage of 70~95% on the bowing occurrence portions.

Figure 4F:
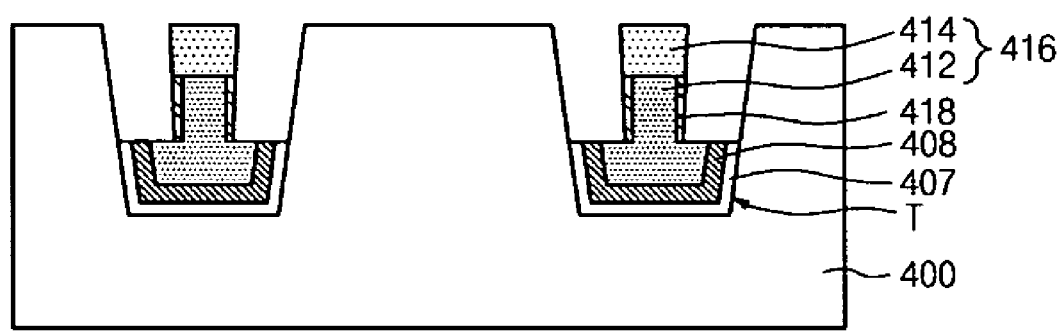
Figure 4F:
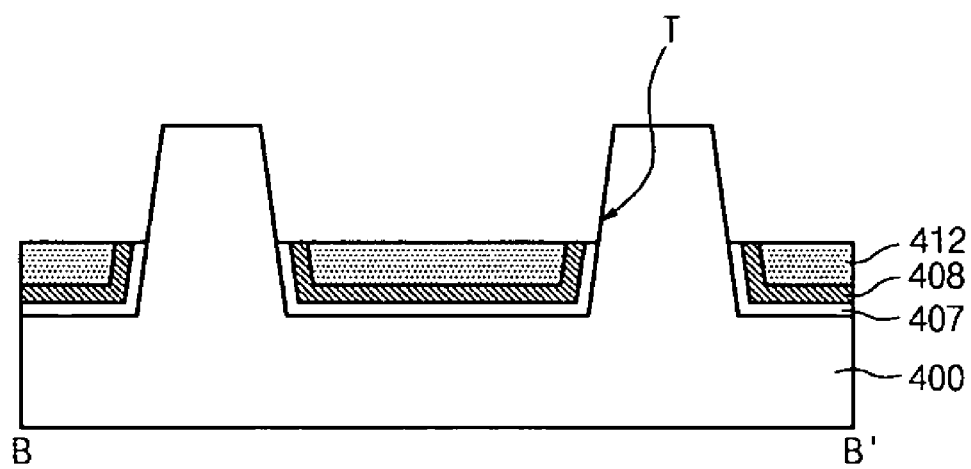

Referring to FIG. 4F, spacers 418 are formed on the bowing occurrence portions of the SOG layer 412 by etching back the spacer insulation layer 418a, and through this, the bowing occurrence portions of the SOG layer 412 are substantially eliminated. The etching back of the spacer insulation layer 418a may be conducted by dry etching using plasma having excellent directionality. A pre-cleaning process is conducted for the resultant substrate formed with the spacers 418 before conducting gate processes. The pre-cleaning step is implemented by wet etching using a diluted HF additive solution or dry etching using plasma such that a thickness of 5~10 Å of the spacer 418 is etched.

Since the pre-cleaning process is conducted in a state in which the bowing occurrence portions of the SOG layer 412 are substantially eliminated through the formation of the spacers 418, it is possible to prevent or at least minimize most problems associated with the bowing phenomenon from further occurring. In particular, it is possible to prevent or at least minimize most occurrences of a short circuit between adjoining gates and prevent or minimize parasitic capacitance from being increased due to any unwanted residual gate material remaining on the bowing portions from interfering with the subsequent gate fabrication processes. Therefore, it is possible to restrain the yield from being decreased and to enhance the reliability of a semiconductor device from being deteriorated.

Figure 4G:
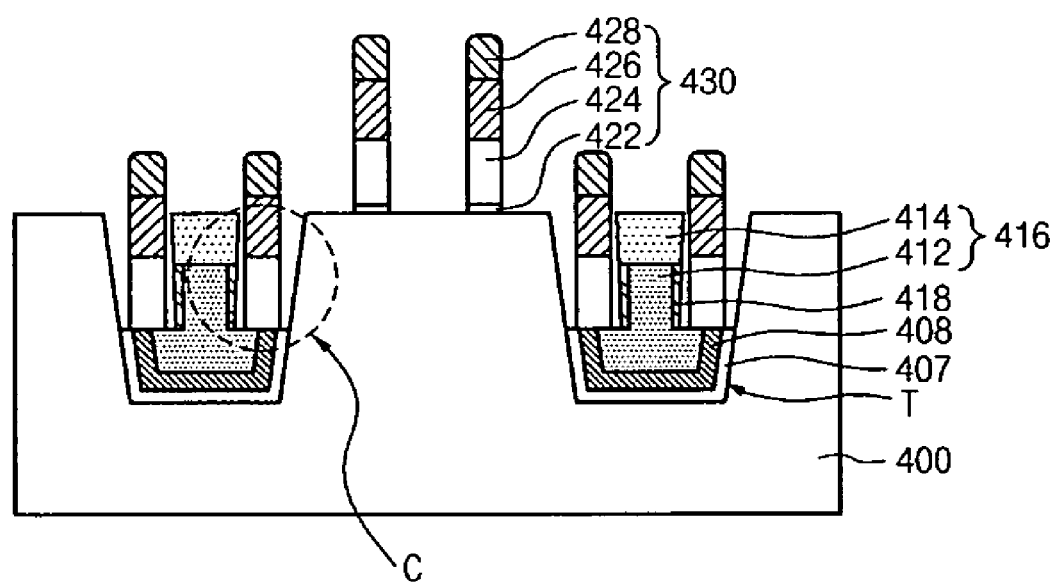
Figure 4G:
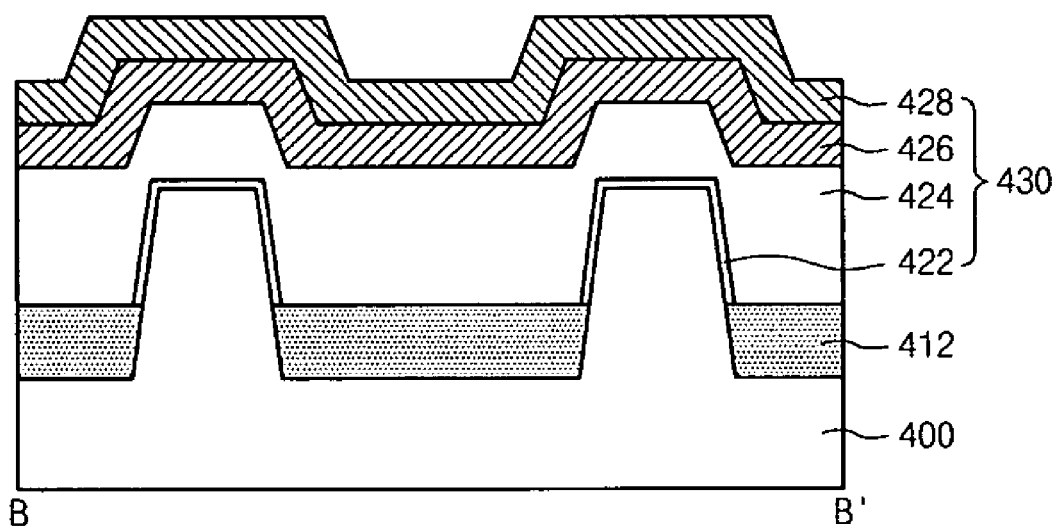

Referring to FIG. 4G, a gate insulation layer 422, a polysilicon layer 424, a metallic layer 426 and a gate hard mask layer 428 are sequentially formed on the resultant substrate including the spacers 418. By etching the gate hard mask layer 428, the metallic layer 426, the polysilicon layer 424 and the gate insulation layer 422, gates 430, which border the active region having exposed side surfaces, are then formed. The gate insulation layer 422 comprises a thermal oxide layer, the metallic layer 426 comprises a tungsten layer or a tungsten silicide layer, and the gate hard mask layer 428 comprises a silicon nitride layer.

Thereupon, while not shown in the drawings, gate spacers are formed on both sidewalls of the gate 430, and source and drain areas are formed on the surface of the active region on both sides of the gate 430 including the gate spacers, as a result of which a pin transistor is formed.

As is apparent from the above description, in the present invention, when forming a pin transistor on a semiconductor substrate in which an isolation structure comprises a stacked layer of an SOG layer and an HDP layer, before conducting gate processes, spacers are formed on the portions of the SOG layer on which bowing occurs, to fill bowing areas, and then, the gate fabricating processes are then performed. By doing this, it is possible to prevent or minimize the occurrence of any residual gate material from occurring in the bowing areas, and therefore, it is possible to avoid or at least minimize the occurrence of a short circuit and accordingly avoid or minimize any decrease of the yield due to any residue of the gate material in the bowing areas. Also, in the present invention, because the increase of parasitic capacitance due to the occurrence of bowing can be prevented or at least minimized, then the reliability of a semiconductor is not deteriorated.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    defining a trench by etching a field region of a semiconductor substrate having an active region and the field region;
    forming a flowable insulation layer in the trench to partially fill the trench;
    forming an isolation structure by depositing a close-packed insulation layer on the flowable insulation layer in the trench to completely fill the trench;
    etching the close-packed insulation layer and a partial thickness of the flowable insulation layer of the isolation structure to expose a portion of the active region;
    cleaning the resultant substrate having the exposed portion of the active region;
    forming spacers on etched portions of the flowable insulation layer on which bowing occurs along the etched portions of the flowable insulation layer during the cleaning step; and
    forming gates on the active region and on the isolation structure to border the exposed portion of active region.

2. The method according to claim 1, wherein the flowable insulation layer comprises an Spin-on Glass (SOG) layer.

3. The method according to claim 1, wherein the close-packed insulation layer comprises a High Density Plasma (HDP) layer.

4. The method according to claim 1, wherein the step of forming a flowable insulation layer comprises the sub steps of:
depositing the flowable insulation layer to fill the trench;
baking the deposited flowable insulation layer;
annealing the baked flowable insulation layer; and
etching back a portion of the annealed flowable insulation layer so that the remaining portion of the annealed flowable insulation layer does not completely fill the trench.

5. The method according to claim 4, wherein the baking step is implemented at a temperature of 100~400° C.

6. The method according to claim 4, wherein the annealing step is implemented at a temperature of 300~700° C. under an atmosphere of any one gaseous phase selected from the group consisting of $O_2$, $H_2+O_2$, $H_2O$ and admixtures thereof.

7. The method according to claim 4, wherein the etching back step is implemented by wet etching using any one etchant selected from the group consisting of a diluted HF solution and a diluted $NH_4F$ solution.

8. The method according to claim 4, wherein the etching back step is implemented such that a remaining portion of the annealed flowable insulation layer remains in the trench at a thickness corresponding to ¼~¾ of a depth of the trench.

9. The method according to claim 4, after the sub step of annealing the baked flowable insulation layer and before the sub step of etching back the annealed flowable insulation layer, further comprising the sub step of:
chemical mechanical polishing a partial thickness of the annealed flowable insulation layer.

10. The method according to claim 1, wherein the step of forming spacers comprises the sub steps of:
forming a spacer insulation layer on the semiconductor substrate including the portions of the flowable insulation layer on which bowing occurs; and
etching back a portion of the spacer insulation layer such that the spacers are formed on the portions of the flowable insulation layer on which bowing occurs, so that bowing is substantially eliminated.

11. The method according to claim 10, wherein the spacer insulation layer comprises a silicon oxide layer.

12. The method according to claim 11, wherein the silicon oxide layer is formed by thermal chemical vapor deposition at a temperature of 700~900° C., with a pressure of 0.05~10 Torr, and using any one source gas selected from the group consisting of $SiH_4$, $Si_2H_6$, $Si_2H_2Cl_2$ and admixtures thereof, and any one reaction gas selected from the group consisting of $N_2O$, $O_2$ and admixtures thereof.

13. The method according to claim 10, wherein the spacer insulation layer formed having a step coverage of 70~95%.

14. The method according to claim 10, wherein the spacer insulation layer is formed to a thickness of 30~200 Å.

15. The method according to claim 10, wherein the sub step of etching back the spacer insulation layer is implemented by dry etching using plasma.

16. The method according to claim 1, after the step of forming spacers and before the step of forming gates, further comprising the step of:
pre-cleaning the resultant substrate formed with the spacers.

17. The method according to claim 16, wherein the pre-cleaning step is implemented by wet etching using an HF additive solution or dry etching using plasma.

18. The method according to claim 16, wherein the pre-cleaning step is implemented such that 5~10 Å of a thickness of the spacer is etched.

19. The method according to claim 1, after the step of defining the trench and before the step of forming the flowable insulation layer, further comprising the steps of:
forming a wall oxide layer on a surface of the trench; and
forming a liner nitride layer on the semiconductor substrate including the wall oxide layer.

* * * * *